United States Patent
Chen et al.

(10) Patent No.: US 12,250,888 B2
(45) Date of Patent: Mar. 11, 2025

(54) METHOD AND STRUCTURE FOR IMPROVED MEMORY INTEGRITY AT ARRAY BOUNDARIES

(71) Applicant: Taiwan Semiconductor Manufacturing Company, Ltd., Hsinchu (TW)

(72) Inventors: Jun-Yao Chen, Taoyuan (TW); Hung Cho Wang, Taipei (TW); Harry-Hak-Lay Chuang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 520 days.

(21) Appl. No.: 17/412,665

(22) Filed: Aug. 26, 2021

(65) Prior Publication Data

US 2023/0061143 A1    Mar. 2, 2023

(51) Int. Cl.
*H10N 50/80* (2023.01)
*H10B 61/00* (2023.01)
*H10N 50/01* (2023.01)
*H10N 50/10* (2023.01)

(52) U.S. Cl.
CPC ............. *H10N 50/80* (2023.02); *H10B 61/10* (2023.02); *H10B 61/20* (2023.02); *H10B 61/22* (2023.02); *H10N 50/01* (2023.02); *H10N 50/10* (2023.02)

(58) Field of Classification Search
CPC ........ H10N 50/80; H10N 50/01; H10N 50/10; H10B 61/00–22
See application file for complete search history.

(56) References Cited

U.S. PATENT DOCUMENTS

| | | | |
|---|---|---|---|
| 11,387,406 B2* | 7/2022 | Peng | G11C 11/161 |
| 2020/0106008 A1* | 4/2020 | Peng | H10B 61/00 |
| 2020/0328251 A1* | 10/2020 | Dutta | H01L 23/53209 |
| 2021/0126051 A1* | 4/2021 | Dutta | H10N 50/01 |
| 2021/0226118 A1* | 7/2021 | Peng | H10N 50/80 |

FOREIGN PATENT DOCUMENTS

CN    112563412 A  *  3/2021  ............. H01L 43/12

* cited by examiner

*Primary Examiner* — Joseph C. Nicely
*Assistant Examiner* — Alvin L Lee
(74) *Attorney, Agent, or Firm* — Eschweiler & Potashnik, LLC

(57) ABSTRACT

The present disclosure relate to semiconductor structure that includes a substrate and a memory array. The memory array is spaced over the substrate and has a plurality of rows and a plurality of columns. Further, the memory array comprises a first memory cell and a second memory cell that are adjacent at a common elevation above the substrate. The second memory cell is at an edge of the memory array and separates the first memory cell from the edge, and a top surface of the first memory cell is recessed relative to a top surface of the second memory cell.

20 Claims, 9 Drawing Sheets

1400 ⇘

```
┌─────────────────────────────────────────────────────────────────────┐
│ Form a protection mask over a protection layer, wherein the        │
│ protection layer extends over a first lower wire, a second lower   │
│ wire, a third lower wire, and a fourth lower wire respectively at  │─ 1402
│ an interior of a memory region, a periphery of a memory region, a  │
│ protection region, and a logic region separated from the memory    │
│ region by the protection region                                     │
└─────────────────────────────────────────────────────────────────────┘
                                  ↓
┌─────────────────────────────────────────────────────────────────────┐
│ Perform a first etch into the protection layer with the protection │─ 1404
│ mask in place to remove the protection layer from the interior of  │
│ the memory region                                                   │
└─────────────────────────────────────────────────────────────────────┘
                                  ↓
┌─────────────────────────────────────────────────────────────────────┐
│ Deposit a top electrode layer over the data storage layer and the  │
│ protection layer, deposit a TEHM layer over the top electrode       │─ 1406
│ layer, and form a first top electrode mask and a second top         │
│ electrode mask over the TEHM layer and respectively overlying the  │
│ first and second BEVAs                                              │
└─────────────────────────────────────────────────────────────────────┘
                                  ↓
┌─────────────────────────────────────────────────────────────────────┐
│ Perform a second etch into the top electrode layer and the TEHM    │
│ layer with the first and second top electrode masks in place to    │─ 1408
│ form a first top electrode structure and a second top electrode    │
│ structure respectively overlying the first and second lower wires  │
└─────────────────────────────────────────────────────────────────────┘
                                  ↓
┌─────────────────────────────────────────────────────────────────────┐
│ Perform a third etch into a data storage layer and a bottom        │
│ electrode layer with the first and second top electrode structures │─ 1410
│ in place to form a first and second memory cell, wherein the third │
│ etch is performed by ion bombardment without chemical reaction     │
└─────────────────────────────────────────────────────────────────────┘
                                  ↓
┌─────────────────────────────────────────────────────────────────────┐
│ Form an interconnect structures over and electrically coupled to   │─ 1412
│ the memory cells and fourth lower wire                              │
└─────────────────────────────────────────────────────────────────────┘
```

Fig. 14

METHOD AND STRUCTURE FOR IMPROVED MEMORY INTEGRITY AT ARRAY BOUNDARIES

BACKGROUND

Many modern-day electronic devices include electronic memory. Electronic memory may be volatile memory or non-volatile memory. Non-volatile memory is able to store data in the absence of power, whereas volatile memory is not. Magnetoresistive random-access memory (MRAM) and resistive random-access memory (RRAM) are promising candidates for next generation non-volatile memory due to relatively simple structures and compatibility with complementary metal-oxide-semiconductor (CMOS) manufacturing processes.

BRIEF DESCRIPTION OF THE DRAWINGS

FIG. 14 illustrates a flow diagram of some embodiments of a method for forming an integrated chip comprising memory cells.

DETAILED DESCRIPTION

Figure 1:
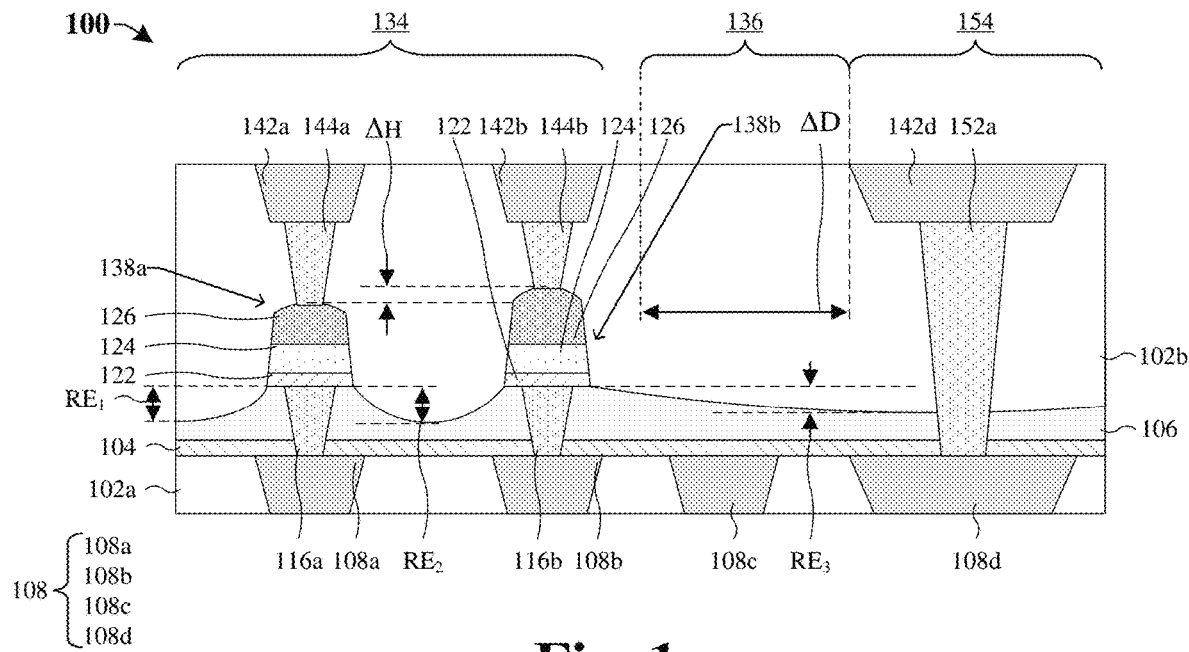
FIG. 1 illustrates a cross-sectional view of some embodiments of an integrated chip comprising memory cells.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may have a protection region laterally between a magnetoresistive random-access memory (MRAM) region and a logic region. According to some methods for forming the IC, a memory film is deposited covering an interlayer dielectric (ILD) layer at the MRAM, logic, and protection regions. The memory film includes a bottom electrode layer, a data storage layer overlying the bottom electrode layer, and a protection layer overlying the data storage layer. A first etch is performed selectively into the protection layer to remove the protection layer from the MRAM and protection regions while the protection layer persists at the logic region. An array of top electrode structures is formed at the MRAM region and a second etch is performed selectively into the data storage layer and the bottom electrode layer with the top electrode structures in place. The second etch removes the memory film and the protection layer from the logic and protection regions. Further, the second etch forms an MRAM array at the MRAM region and defined in part by the array of top electrode structures.

The second etch may be performed by reactive ion etching (RIE), ion beam etching (IBE), or some other suitable type of etching. RIE depends upon a chemical reaction and therefore has a propensity to damage sidewalls of the MRAM array. This may, in turn, degrade electrical properties of the MRAM array, such as tunnel magnetoresistance ratio and coercivity. IBE does not depend upon a chemical reaction and therefore does not lead to chemical etch damage on memory sidewalls. However, IBE has poor etch rate uniformity. When the second etch is performed by IBE, variations in feature density lead to a first etch rate between cells of the MRAM array and a second etch rate greater than the first etch rate outside the MRAM array at the protection region. Because the second etch rate is greater, IBE can result in undesired and excessive over etching into the ILD layer at the protection region. This over etching may extend completely through the ILD layer to an underlying wire at the protection region, whereby the wire may under undergo physical bombardment by ions. This may lead to conductive material of the wire (e.g., copper or some other suitable material) extruding or otherwise moving outward, whereby it may cause contamination and/or reliability defects.

Various embodiments of the present disclosure are directed towards a method of forming the MRAM array with IBE in a manner that prevents material of the wire from extruding or otherwise moving outward and causing contamination and reliability defects. Further, various embodiments of the present disclosure are directed towards the structure that results from the method. Notwithstanding that the method is described with regard to MRAM, the method is applicable to other types of memory.

According to some embodiments of the method, the first etch is performed selectively into the protection layer to remove the protection layer from an interior of the MRAM region while the protection layer persists at a periphery of the MRAM region and the logic and protection regions. An array of top electrode structures is formed at the MRAM region. A first top electrode structure at the interior of the MRAM region is spaced from the protection layer, and a second top electrode structure at the periphery of the MRAM region overlies the protection layer. The second etch is performed selectively into the data storage layer and the bottom electrode layer with the top electrode structures in place. The second etch removes the memory film and the protection layer from the logic and protection regions and localizes a portion of the protection layer directly under the second top electrode structure. Further, the second etch forms an MRAM array at the MRAM region. A first memory cell is formed at the first top electrode structure, and a second memory cell is formed at the second top electrode structure.

Because the protection layer covers the protection region at a beginning of the second etch, the protection layer provides protection for the wire and the ILD layer at the protection region. Despite the higher etch rate at the protection region, the second etch does not extend through the ILD layer to expose the wire. As a result, material of the wire does not extrude or otherwise move outward and hence does not cause contamination and/or reliability defects. Additionally, because the second top electrode structure is formed overlying the protection layer, the second memory cell has a top electrode with a top surface elevated above that of the first memory cell.

FIG. 1 illustrates a cross-sectional view 100 of some embodiments of an IC. The IC includes a lower inter-metal dielectric (IMD) layer 102a in which a plurality of lower wires 108 is deposited. The plurality of lower wires 108 comprises a first lower wire 108a, a second lower wire 108b, a third lower wire 108c, and a fourth lower wire 108d. The first and second lower wires 108a, 108b are at a memory region 134 of the IC, the fourth lower wire 108d is at a logic region 154 of the IC, and the third lower wire 108c is at a protection region 136 of the IC that separates the logic region 154 and the memory region 134. Further, the second lower wire 108b is between the first lower wire 108a and the third lower wire 108c, and the third lower wire 108c is between the second lower wire 108b and the fourth lower wire 108d. The plurality of lower wires 108 extend from a bottom surface of the lower IMD layer 102a to a top surface of the lower IMD layer 102a.

An etch stop layer 104 is disposed over the lower IMD layer 102a and the plurality of lower wires 108. In some embodiments, the etch stop layer 104 may, for example, be or comprise silicon carbon nitride (SiCN), a nitride doped carbon, some other suitable silicon carbon with heavy nitrogen doping, or the like.

An inter-layer dielectric (ILD) layer 106 is disposed over the etch stop layer 104 and the plurality of lower wires 108. An upper IMD layer 102b is disposed over the ILD layer 106 and the plurality of lower wires 108. In some embodiments, the lower IMD layer 102a, the ILD layer 106, and the upper IMD layer 102b may, for example, be or comprise silicon dioxide, a low-k dielectric material, an extreme low-k dielectric material, or the like.

A first bottom electrode via (BEVA) 116a and a second BEVA 116b extend through the etch stop layer 104 and the ILD layer 106 respectively from the first and second lower wires 108a, 108b. Lower portions of the first and second BEVAs 116a, 116b have sidewalls contacting the etch stop layer 104 and upper portions of the first and second BEVAs 116a, 116b have sidewalls contacting the ILD layer 106. The first and second BEVAs 116a, 116b may, for example, be or comprise titanium nitride, tantalum nitride, copper, some other suitable metal(s), or any combination of the foregoing.

A first memory cell 138a and a second memory cell 138b are at a common elevation. Further, the first and second memory cells 138a, 138b are disposed within the upper IMD layer 102b and are respectively on and electrically coupled to the first and second BEVAs 116a, 116b. The first and second memory cells 138a, 138b are each configured to reversibly change between a first data state and a second data state depending upon a voltage applied across the memory cell. The first and second memory cells 138a, 138b may, for example, be magnetoresistive random-access memory (MRAM) cells, but other suitable types of memory cells are amenable.

The first and second memory cells 138a, 138b include individual bottom electrodes 122, individual data storage elements 124, and individual top electrodes 126. The data storage elements 124 respectively overlie the bottom electrodes 122, and the top electrodes 126 respectively overlie the data storage elements 124. In embodiments in which the first and second memory cells 138a, 138b are MRAM cells, the data storage elements 124 may, for example, be magnetic tunnel junction (MTJ) films. The top electrode 126 of the first memory cell 138a has a height less than the top electrode 126 of the second memory cell 138b, such that a top surface of the first memory cell 138a is recessed relative to a top surface of the second memory cell 138b by a height differential $\Delta H$. In some embodiments, the height differential $\Delta H$ is about 200-300 angstroms, about 200-250 angstroms, about 250-300 angstroms, or some other suitable value. A ratio of a top surface elevation of the first memory cell 138a to a top surface elevation of the second memory cell 138b may be 1:1.25 to 1:1.5. If the height differential $\Delta H$ is too small, a protection layer (e.g., see protection layer 606 of FIG. 3d) is small and the third wire 108c and a corresponding portion of the ILD layer 106 may not have meaningful protection during manufacture of the integrated chip. If the height differential $\Delta H$ is too large, the topography may be so different that it causes an unacceptable amount of non-uniformity for downstream processing (e.g., CMP process), which may degrade yields. As will be seen hereafter, the height differential $\Delta H$ results from a method of forming the first and second memory cells 138a, 138b with IBE in a manner that prevents material of the third lower wire 108c from extruding or otherwise moving outward and causing contamination and reliability defects.

The top electrodes 126 and the bottom electrodes 122 may be or otherwise comprise, for example, tantalum nitride, titanium nitride, platinum, iridium, ruthenium, tungsten, or some other suitable conductive material(s). The data storage elements 124 may be or otherwise comprise, for example, a high-k dielectric, such as, for example, hafnium oxide, another metal oxide, a MTJ film, or some other suitable data storage film.

A first top electrode via (TEVA) 144a extends from a top surface of the first memory cell 138a to a first upper wire 142a. A second TEVA 144b extends from a top surface of the second memory cell 138b to a second upper wire 142b. A first inter-wire via 152a extends from a top surface of the fourth lower wire 108d to a third upper wire 142d.

The first BEVA 116a, the second BEVA 116b, the first TEVA 144a, the second TEVA 144b, the first inter-wire via 152a, or any combination (e.g., all or a subset) of the foregoing may be or comprise, for example, copper, aluminum copper, aluminum, tungsten, some other suitable metal, or some other suitable conductive material. The plurality of lower wires 108, the first upper wire 142a, the second upper wire 142b, and the third upper wire 142d may be or comprise, for example, aluminum copper, copper, aluminum, or some other suitable conductive material. The fourth lower wire 108d, the first inter-wire via 152a, and the third upper wire 142d are within the logic region 154, whereas the third lower wire 108c is within the protection region 136. In some embodiments, the protection region 136 separates the memory region 134 from the logic region 154 by a protection distance $\Delta D$ that is about 150-200 nanometers or some other suitable value.

The ILD layer 106 has a first top surface portion arcing from the first memory cell 138a away from the second memory cell 138b and has a second top surface portion arcing from the first memory cell 138a to the second memory cell 138b. Further, the ILD layer 106 has a third top surface portion arcing across the third lower wire 108c and fourth lower wire 108d from the second memory cell 138b. The first top surface portion has a first recess $RE_1$, the second top surface portion has a second recess $RE_2$, and the third top surface portion has a third recess $RE_3$. In some embodiments, the first, second, and third recesses $RE_1$, $RE_2$, $RE_3$ may have a U-shaped profile.

In some embodiments, a lowest point of the first recess $RE_1$ is elevated relative to a lowest point of the second recess $RE_2$ and is recessed relative to a lowest point of the third recess $RE_3$. In other embodiments, the lowest point of the first recess $RE_1$ is level with the lowest point of the second recess $RE_2$, but the lowest points of the first and second recesses $RE_1$, $RE_2$ are still recessed relative to the lowest point of the third recess $RE_3$. In some embodiments, the first and second recesses $RE_1$, $RE_2$ have depths of about 300-400 angstroms or some other suitable value, and the third recess $RE_3$ has a depth of about 50-100 angstroms or some other suitable value. In some embodiments, a depth of the third recess $RE_3$ directly over the third lower wire 108c is less than a depth of the second recess $RE_2$ at a center between the first and second memory cells 138a, 138b. Further, in some embodiments, the depth of the third recess $RE_3$ directly over the third lower wire 108c is the same as the depth at the lowest point of the third recess $RE_3$.

As will be seen hereafter, the first, second, and third recesses $RE_1$, $RE_2$, $RE_3$ result from over etching while forming the first and second memory cells 138a, 138b. Because the first, second, and third recesses $RE_1$, $RE_2$, $RE_3$ do not extend completely through the ILD layer 106 and the etch stop layer 104, none of the plurality of lower wires 108 undergo exposure to etchants during the forming of the first and second memory cells 138a, 138b. For example, when IBE is employed to form the first and second memory cells 138a, 138b, the ILD layer 106 and the etch stop layer 104 prevent the plurality of lower wires 108 from undergoing physical bombardment by ions. This prevents undesirable extrusion or outward movement of material from the plurality of lower wires 108, which could lead to contamination and reliability defects.

Figure 2:
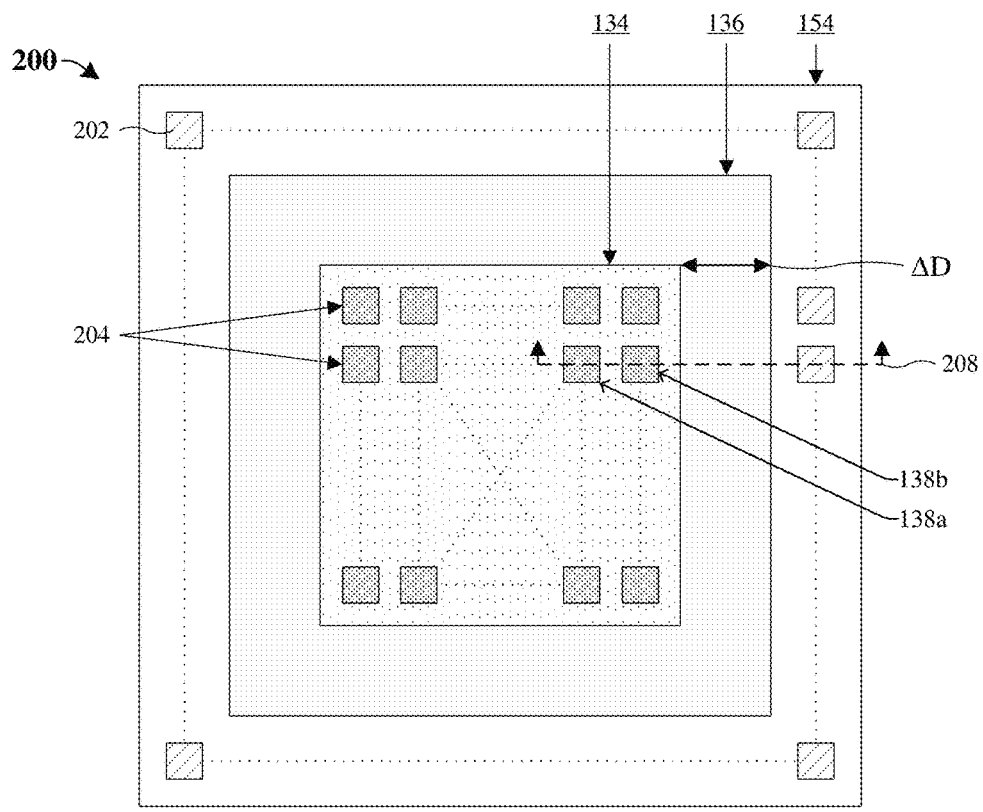
FIG. 2 illustrates a top layout of some embodiments of the integrated chip of FIG. 1.

FIG. 2 illustrates a top layout 200 of some embodiments of the IC of FIG. 1. The cross-sectional view of FIG. 1 may, for example, be taken along line 208. The memory region 134 defines a memory array 204 with a plurality of rows and a plurality of columns. The memory array 204 comprises the first and second memory cells 138a, 138b. The second memory cell 138b is at an edge of the memory region 134 and separates the first memory cell 138a from the edge. The protection region 136 extends in a closed path around the memory region 134, and the logic region 154 extends in a closed path around the protection region 136. The protection region 136 has the protection distance ΔD between the memory region 134 and the logic region 154. As such, the protection region 136 separates the logic region 154 from the memory region 134. The logic region 154 includes a logic array that may, for example, comprise a plurality of logic devices 202 separated from the memory region 134 by the protection region 136.

Figure 3A:
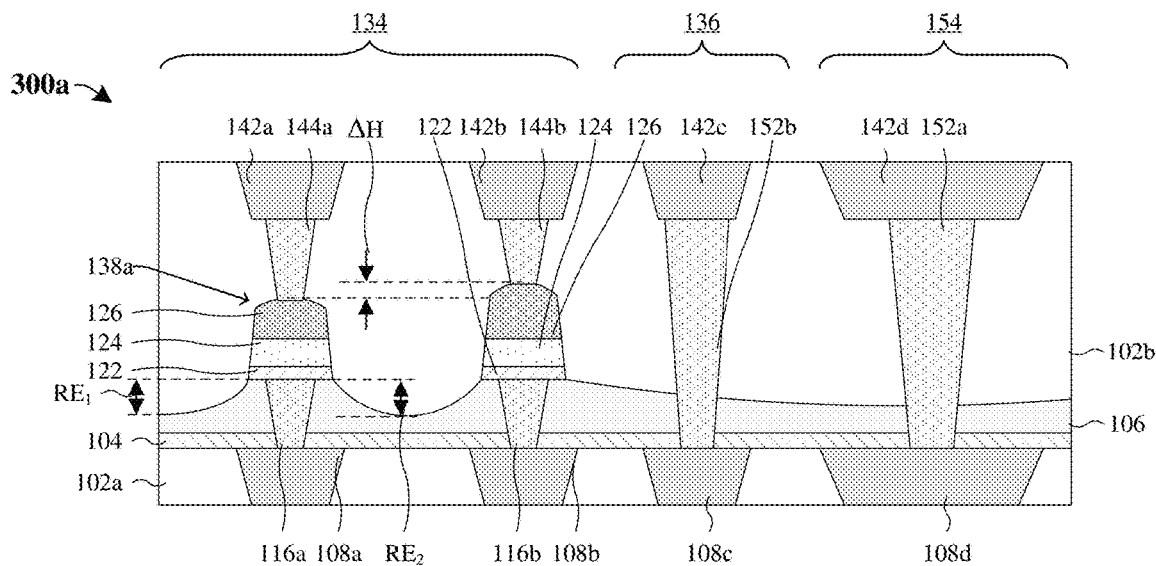
FIGS. 3A-3D illustrate cross-sectional views of some alternative embodiments of the integrated chip of FIG. 1.

FIG. 3a illustrates a cross-sectional view 300a of some alternative embodiments of the IC of FIG. 1 in which a second inter-wire via 152b extends from the third lower wire 108c to a fourth upper wire 142c. The second inter-wire via 152b and the fourth upper wire 142c are within the protection region 136, and the fourth upper wire 142c is between the second and third upper wires 142b, 142d. The second inter-wire via 152b may be or comprise, for example, copper, aluminum copper, aluminum, tungsten, some other suitable metal, or some other suitable conductive material. The fourth upper wire 142c may be or comprise, for example, aluminum copper, copper, aluminum, or some other suitable conductive material.

Figure 3B:
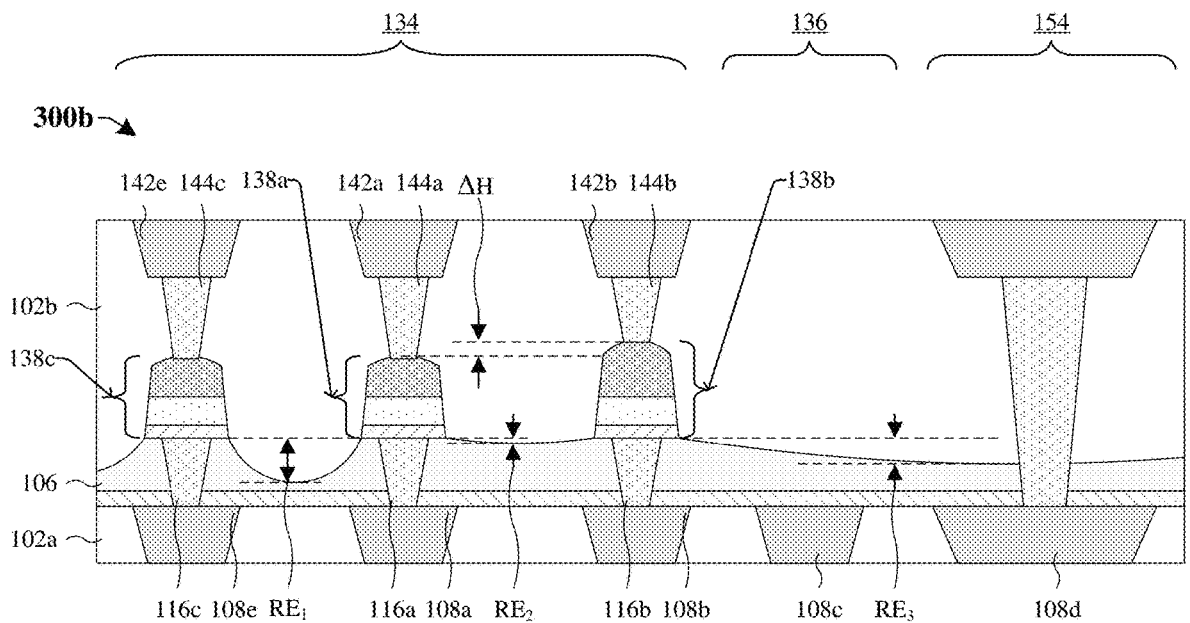

FIG. 3b illustrates a cross-sectional view 300b of some alternative embodiments of the IC of FIG. 1 in which a third memory cell 138c is on an opposite side of the first memory cell 138a as the second memory cell 138b.

A fifth lower wire 108e is disposed within the lower IMD layer 102a, and a third BEVA 116c extends from the fifth lower wire 108e to the third memory cell 138c. A third TEVA 144c extends from a top surface of the third memory cell 138c to a fifth upper wire 142e. A top surface portion of the ILD layer 106 extends from the third memory cell 138c to the first memory cell 138a and has the first recess $RE_1$. The first recess $RE_1$ has a depth that is greater than the second and third recesses $RE_2$, $RE_3$, and the third recess $RE_3$ has a depth greater than the second recess $RE_2$. As such, the first recess $RE_1$ extends lower than the lowest point of the second recess $RE_2$ and the lowest point of the third recess $RE_3$. Further, a lowest point of the second recess $RE_2$ is higher than a lowest point of the third recess $RE_3$.

Figure 3C:
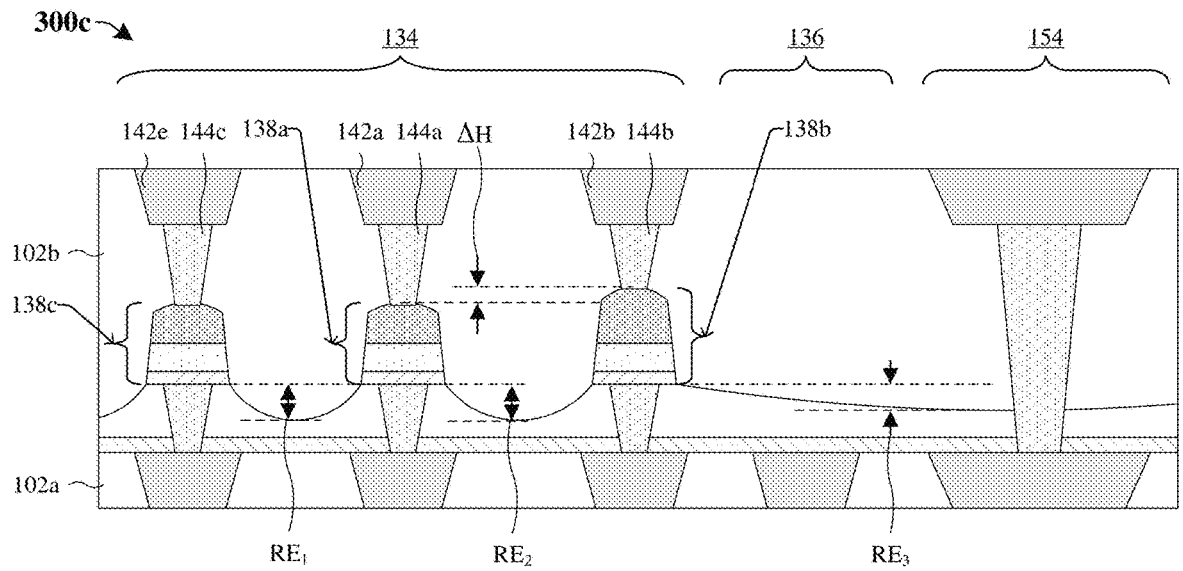

FIG. 3c illustrates a cross-sectional view 300c of some alternative embodiments of the IC of FIG. 3b in which the first and second recesses $RE_1$, $RE_2$ have the same depth. As such, the first recess $RE_1$ has a lowest point that is level with a lowest point of the second recess $RE_2$. Further, the lowest points of the first and second recesses $RE_1$, $RE_2$ are lower than a lowest point of the third recess $RE_3$. The different depths of the first, second, and third recesses $RE_1$, $RE_2$, $RE_3$ may, for example, result from over etching at differing etch rates while forming the first, second, and third memory cells 138a, 138b, 138c.

Figure 3D:
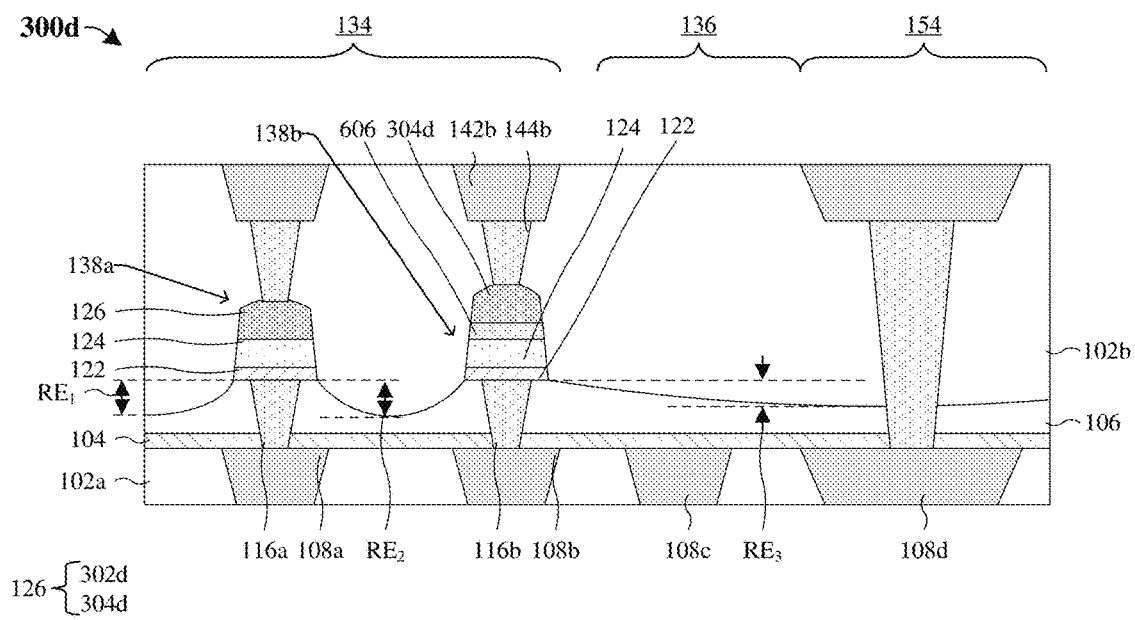

FIG. 3d illustrates a cross-sectional view 300d of some alternative embodiments of the IC of FIG. 1 in which the top electrode 126 of the second memory cell 138b comprises a protection layer 606 and a top electrode portion 304d. The protection layer 606 separates the top electrode portion 304d from the data storage element 124. The top electrode portion 304d may be or otherwise comprise, for example, tantalum nitride, titanium nitride, platinum, iridium, ruthenium, tungsten, or some other conductive material. The protection layer 606 may be conductive or non-conductive. In some embodiments, the protection layer 606 may be or otherwise comprise, for example, tantalum nitride, titanium nitride, platinum, iridium, ruthenium, tungsten, the same material as the top electrode portion 304d, or some other conductive material. Alternatively, in some embodiments, the protection layer 606 may be or otherwise comprise, for example, silicon oxide, a low-k dielectric material, an extreme low-k dielectric material, some other suitable non-conductive material, and/or some other suitable dielectric(s). When the protection layer 606 is conductive, it can be considered as part of the top electrode 126 of the second memory cell 138b and can aid in operation of the second memory cell 138b. When the protection layer 606 is non-conductive, the second memory cell 138b may be considered a dummy cell that does not function as an operable memory device. A height of the protection layer 606 may be less than, equal to, or greater than a height of the top electrode portion 304d.

Figure 4:
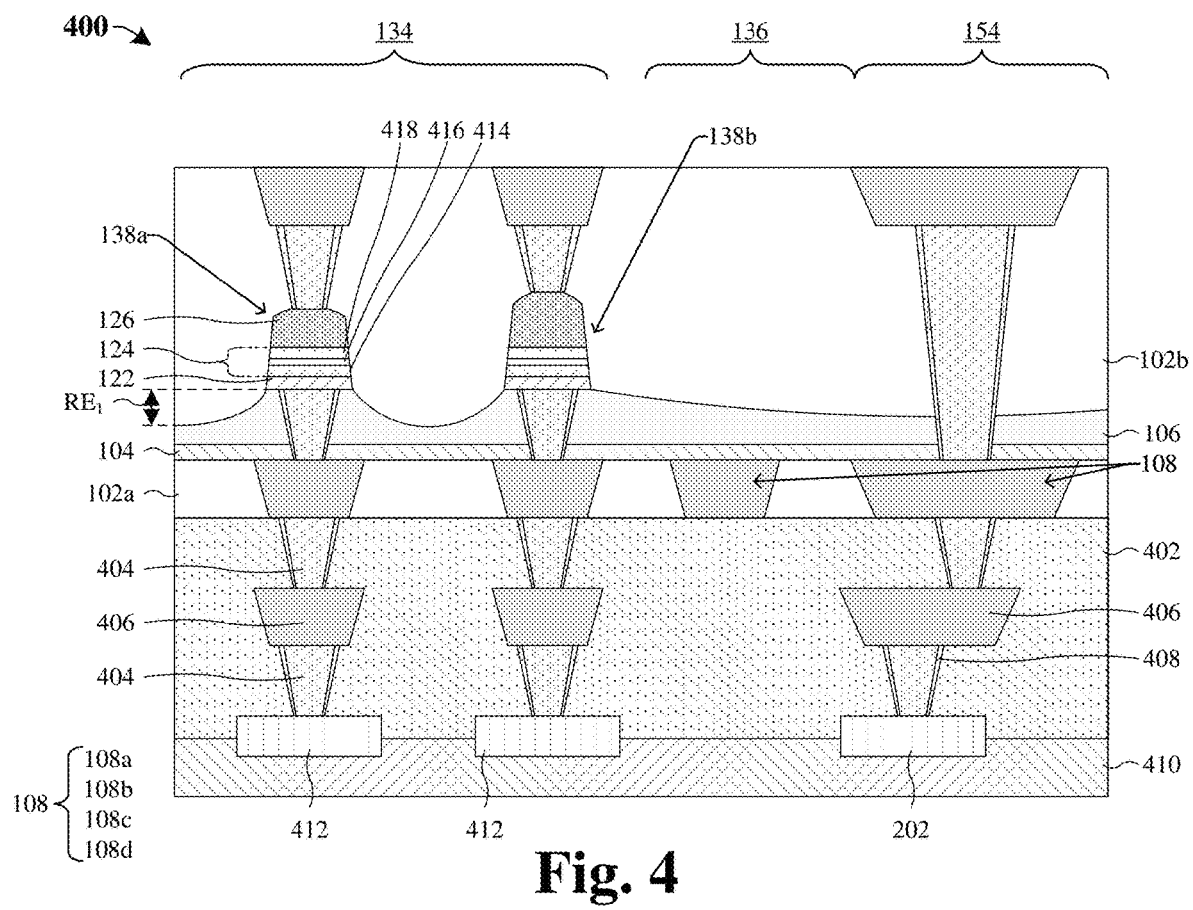
FIG. 4 illustrates an expanded cross-sectional view of some embodiments of the integrated chip of FIG. 1.

FIG. 4 illustrates an expanded cross-sectional view 400 of some embodiments of the IC of FIG. 1. For ease of illustration, only some of the features are labeled. As illustrated, a lower interconnect dielectric layer 402 is disposed under the lower IMD layer 102a, and a semiconductor substrate 410 is disposed under the lower interconnect dielectric layer 402. In some embodiments, the lower interconnect dielectric layer 402 may, for example, be or comprise silicon dioxide, a low-k dielectric material, an extreme low-k dielectric material, or the like. In some embodiments, the semiconductor substrate 410 may, for example, be or comprise a bulk silicon substrate, a silicon-on-insulator (SOI) substrate, or some other suitable type of semiconductor substrate.

A plurality of interconnect vias 404 and a plurality of interconnect wires 406 are disposed within the lower interconnect dielectric layer 402 and are coupled to the plurality of lower wires 108 to facilitate connection with access devices 412 within the memory region 134 and a logic device 202 within the logic region 154. The interconnect vias 404 and the interconnect wires 406 are alternatingly stacked to define conductive paths from the access and logic devices 412, 202 respectively to the lower wires 108. The plurality of interconnect vias 404 may be or comprise, for example, copper, aluminum copper, aluminum, tungsten, some other suitable metal, or some other suitable conductive material. The plurality of interconnect wires 406 may be or comprise, for example, aluminum copper, copper, aluminum, or some other suitable conductive material.

The access devices 412 and the logic device 202 are recessed into a top surface of the semiconductor substrate 410, between the semiconductor substrate 410 and the lower interconnect dielectric layer 402. In some embodiments, at least one of the access devices 412 underlies each memory cell in the memory region 134, between the semiconductor substrate 410 and the lower interconnect dielectric layer 402. The access devices 412 may be, for example, insulated gate field-effect transistors (IGFETs), metal-oxide-semiconductor field-effect transistors (MOSFETs), fin field-effect transistors (FinFETs), gate-all-around field-effect transistors (GAAFETs), or some other suitable type of transistor. The access devices 412 may, for example, facilitate reading and writing of data to the first and second memory cells 138a, 138b. The logic device 202 may be, for example, an IGFET, a MOSFET, a FinFET, a GAAFET, or some other suitable type of transistor.

In some embodiments, a plurality of liner barriers 408 line the plurality of interconnect vias 404, the first BEVA 116a, the second BEVA 116b, the first TEVA 144a, the second TEVA 144b, and first inter-wire via 152a, so as to prevent materials of the vias from moving (e.g., diffusing) out of the vias. The liner barriers 408 may be or comprise, for example, titanium nitride, tantalum, tantalum nitride, titanium, or some other suitable barrier material.

The data storage elements 124 comprise individual fixed elements 414, individual free elements 418 respectively over the fixed elements 414, and individual barrier elements 416 vertically and respectively between the fixed and free elements 414, 418. In alternative embodiments, the free elements 418 are respectively under the fixed elements 414. The fixed and free elements 414, 418 are ferromagnetic. Further, the fixed elements 414 have individual magnetizations that are fixed, whereas the free elements 418 have individual magnetizations that are "free" to change and that are used to represent data. The barrier elements 416 are non-magnetic and are sandwiched respectively between the fixed and free elements 414, 418.

During operation of the first or second memory cell 138a, 138b, the barrier element 416 of the corresponding memory cell selectively allows quantum mechanical tunneling of electrons through the barrier element 416. When the magnetizations of the fixed and free elements 414, 418 of the corresponding memory cell are antiparallel, quantum mechanical tunneling may be blocked. As such, the barrier element 416 of the corresponding memory cell may have a high resistance and may be in the first data state. When the magnetizations of the fixed and free elements 414, 418 of the corresponding memory cell are parallel, quantum mechanical tunneling may be allowed. As such, the barrier element 416 of the corresponding memory cell may have a low resistance and may be in the second data state.

The barrier elements 416 may, for example, be or comprise an amorphous barrier, a crystalline barrier, or some other suitable insulating and/or tunnel barrier material. The amorphous barrier may be or comprise, for example, aluminum oxide (e.g., $AlO_x$), titanium oxide (e.g., $TiO_x$), or some other suitable amorphous barrier. The crystalline barrier may, for example, be or comprise manganese oxide (e.g., MgO), spinel (e.g., $MgAl_2O_4$), or some other suitable crystalline barrier. The fixed elements 414 and/or the free elements 418 may, for example, be or comprises cobalt iron (e.g., CoFe), cobalt iron boron (e.g., CoFeB), some other suitable ferromagnetic material(s), or any combination of the foregoing.

With reference to FIGS. 5-13, a series of cross-sectional views 500-1300 of some embodiments of a method for forming an IC comprising memory cells is provided. The IC may, for example, be as described at FIG. 1 except at least for inclusion of barrier liners. Further, while the method illustrates formation of the IC according to embodiments different than those in FIGS. 1, 2, 3a-3d, and 4, the method may also be employed to form the IC according to the embodiments in any of FIGS. 1, 2, 3a-3d, and 4.

Figure 5:
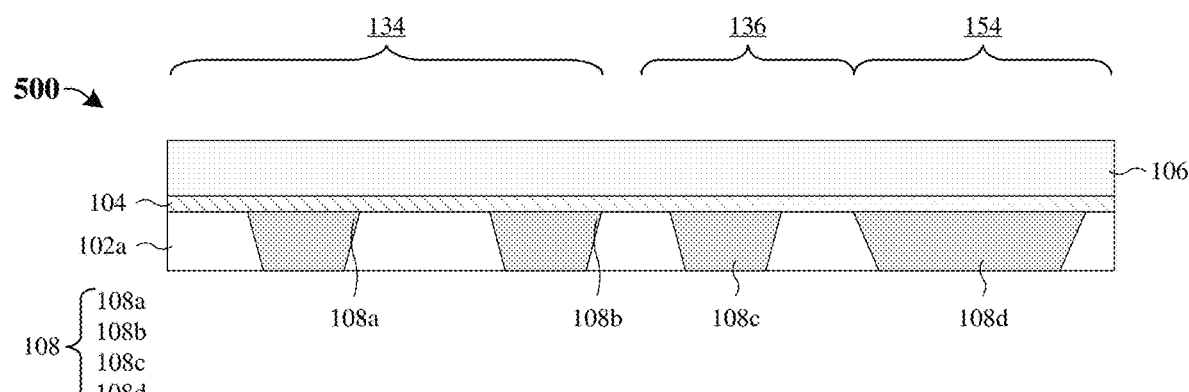
FIGS. 5-13 illustrate a series of cross-sectional views of some embodiments of a method for forming an integrated chip comprising memory cells.

As illustrated in the cross-sectional view 500 of FIG. 5, a lower inter-metal dielectric (IMD) layer 102a is deposited. In some embodiments, the lower IMD layer 102a is deposited overlying the interconnect structure, the access and logic devices 412, 202, and the semiconductor substrate 410 in FIG. 4. As seen at FIG. 4, the interconnect structure includes the interconnect vias 404 of FIG. 4 and the interconnect wires 406 of FIG. 4. The lower IMD layer 102a may, for example, be or comprise silicon dioxide, a low-k dielectric material, an extreme low-k dielectric material, or the like. Deposition of the lower IMD layer 102a may, for example, be performed by or comprise chemical vapor deposition (CVD), physical vapor deposition (PVD), some other suitable deposition process, or any combination of the foregoing.

A first lower wire 108a, a second lower wire 108b, a third lower wire 108c, and a fourth lower wire 108d are formed within the lower IMD layer 102a. The first and second lower wires 108a, 108b are formed at memory region 134 of the IC, and the fourth lower wire 108d is formed at a logic region 154 of the IC. Further, the third lower wire 108c is formed at a protection region 136 of the IC that separates the memory and logic regions 134, 154. The second lower wire 108b is between the first and third lower wires 108a, 108c, and the third lower wire 108c is between the second and fourth lower wires 108b, 108d. In some embodiments, the memory region 134, the logic region 154, and the protection region 136 have top layouts as in FIG. 2. The plurality of lower wires 108 may be or comprise, for example, aluminum copper, copper, aluminum, or some other suitable conductive material.

An etch stop layer 104 is deposited over the lower IMD layer 102a and the plurality of lower wires 108, and an inter-layer dielectric (ILD) layer 106 is deposited over the etch stop layer 104. Deposition of the etch stop layer 104 and/or the ILD layer 106 may, for example, be performed by or comprise chemical vapor deposition (CVD), physical vapor deposition (PVD), some other suitable deposition process, or any combination of the foregoing.

Figure 6:
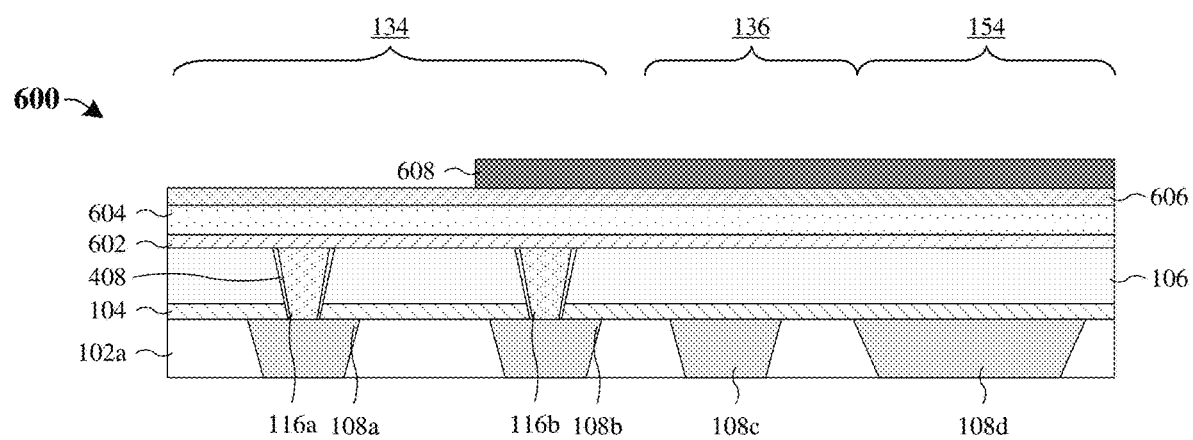

As illustrated in the cross-sectional view 600 of FIG. 6, a first bottom electrode via (BEVA) 116a and a second BEVA 116b are formed within the ILD layer 106 and the etch stop layer 104. Further, liner barriers 408 are formed along sidewalls of the first and second BEVAs 116a, 116b. The liner barriers 408 prevent materials from the first and second BEVAs 116a, 116b from moving (e.g., diffusing) out of the BEVAs and may be or comprise, for example, titanium nitride, tantalum, tantalum nitride, titanium, or some other suitable barrier material. The first BEVA 116a and the second BEVA 116b extend respectively from the first lower wire 108a and the second lower wire 108b respectively to a top surface of the ILD layer 106. The first and second BEVAs 116a, 116b may, for example, be or comprise titanium nitride, tantalum nitride, copper, some other suitable metal(s), or any combination of the foregoing.

A bottom electrode layer 602 is deposited over the ILD layer 106, and a data storage layer 604 is deposited over the bottom electrode layer 602. Further, a protection layer 606 is deposited over the data storage layer 604. The bottom electrode layer 602, the data storage layer 604, and the protection layer 606 laterally extend to overlie the plurality of lower wires (e.g., the first lower wire 108a, the second lower wire 108b, etc.). In some embodiments, deposition of the bottom electrode layer 602, the data storage layer 604, the protection layer 606, or any one or combination (e.g., all) of the foregoing may, for example, be performed by or comprise CVD, PVD, some other suitable deposition process, or any combination of the foregoing.

The bottom electrode layer 602 may be or otherwise comprise, for example, tantalum nitride, titanium nitride, platinum, iridium, ruthenium, tungsten, or some other suitable conductive material. The data storage layer 604 may be or otherwise comprise, for example, a high-k dielectric, such as, for example, hafnium oxide, another metal oxide, a MTJ film, or some other suitable data storage film. The protection layer 606 is conductive and, in some embodiments, is a same material as the bottom electrode layer 602. For example, the protection layer 606 may be or comprise, for example, tantalum nitride, titanium nitride, platinum, iridium, ruthenium, tungsten, or some other suitable conductive material. In other embodiments, the protection layer 606 is dielectric. For example, the protection layer 606 may be or comprise silicon oxide, a low-k dielectric material, an extreme low-k dielectric material, and/or some other suitable dielectric(s).

A protection mask 608 is formed over the protection layer 606. The protection mask 608 covers the logic and protection regions 154, 136, as well as a periphery of the memory region 134, while remaining spaced from an interior of the memory region 134. As such, the protection mask 608 covers the second, third, and fourth lower wires 108b, 108c, 108d, but not the first lower wire 108a. Hence, a top surface portion of the protection layer 606 directly above the first lower wire 108a is uncovered by the protection mask 608. The protection mask 608 may be or comprise, for example, photoresist, silicon nitride, or some other suitable mask material. In some embodiments, a process for forming the protection mask 608 comprises depositing a mask layer and subsequently patterning the mask layer into the protection mask 608. In embodiments in which the mask layer is photoresist, the patterning may, for example, be performed using photolithography or some other suitable process.

Figure 7:
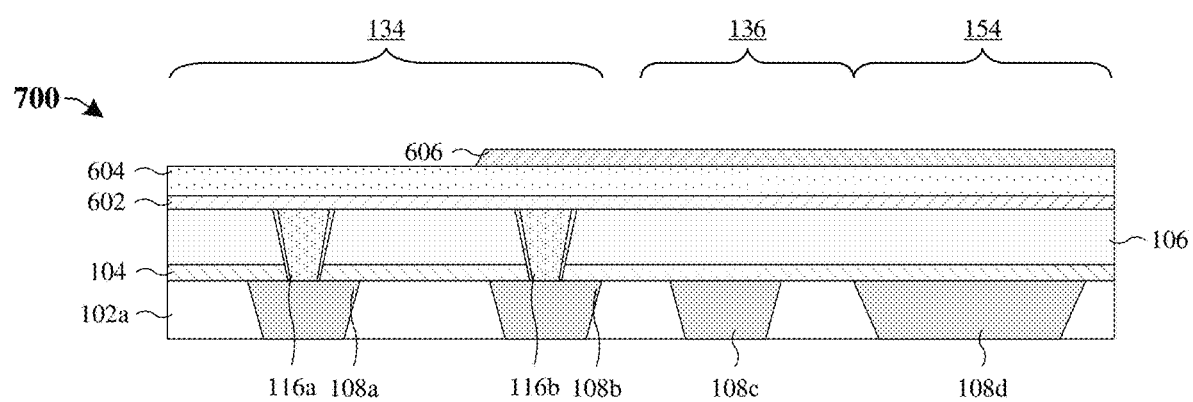

As illustrated in the cross-sectional view 700 of FIG. 7, a first etch is performed selectively into the protection layer 606 with the protection mask 608 (see, e.g., FIG. 6) in place. The first etch stops on the data storage layer 604 and transfers a pattern of the protection mask 608 to the protection layer 606. As such, the first etch localizes the protection layer 606 to the logic and protection regions 154, 136 and the periphery of the memory region 134. In other words, the first etch removes a portion of the protection layer 606 overlying the first lower wire 108a at an interior of the memory region 134. The first etch forms a slanted sidewall in the protection layer 606. The slanted sidewall is between the first and second lower wires 108a, 108b. In alternative embodiments, the slanted sidewall has some other suitable profile.

Figure 8:
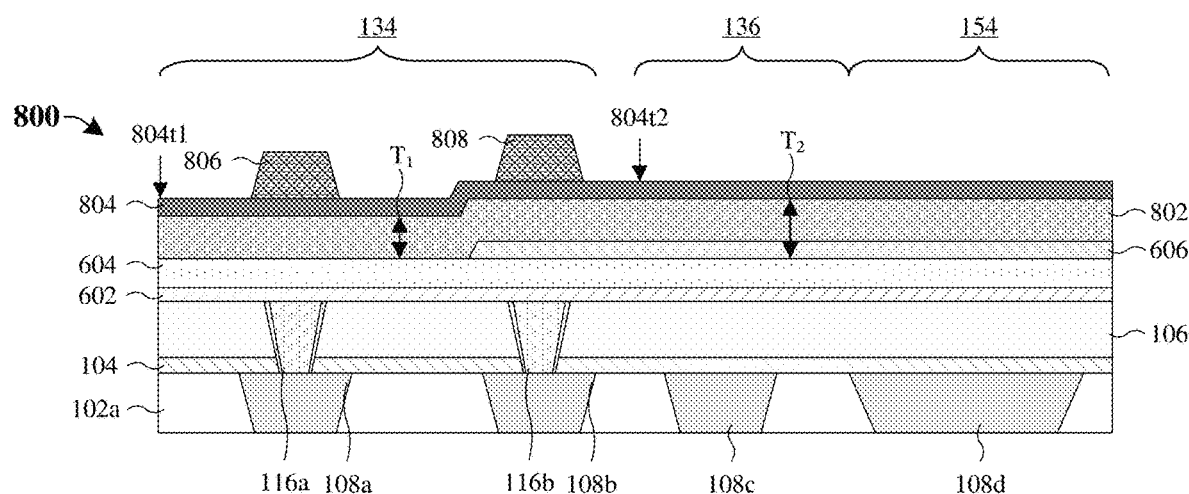

As illustrated in the cross-sectional view 800 of FIG. 8, a top electrode layer 802 is deposited covering the memory, logic, and protection regions 134, 154, 136 over the protection layer 606 and the data storage layer 604. Further, a top electrode hard mask (TEHM) layer 804 is deposited over the top electrode layer 802. In some embodiments, deposition of the TEHM layer 804 and/or the top electrode layer 802 is performed by or comprises CVD, PVD, some other suitable deposition process, or any combination of the foregoing.

The top electrode layer 802 may be or otherwise comprise, for example, tantalum nitride, titanium nitride, platinum, iridium, ruthenium, tungsten, or some other suitable conductive material. In some embodiments, the top electrode layer 802 and the protection layer 606 are the same material.

The TEHM layer 804 is deposited over the top electrode layer 802 with a first top surface portion 804t1 at the interior of the memory region 134 and further with a second top surface portion 804t2 at the logic and protection regions 154, 136 and the periphery of the memory region 134. Because of the protection layer 606, the second top surface portion 804t2 is elevated relative to the first top surface portion 804t1. The TEHM layer 804 may be or otherwise comprise, for example, silicon nitride, silicon oxide, some other suitable dielectric, or a combination of the foregoing.

Because of the protection layer 606, material thickness above the data storage layer 604 is greater at the logic and protection regions 154, 136 and the periphery of the memory region 134 than at the interior of the memory region 134. For example, a material thickness $T_1$ at the interior of the memory region 134 is less than a material thickness $T_2$ at the logic and protection regions 154, 136 and the periphery of the memory region 134. As seen hereafter, the increased material thickness may counter increased etch rates at the logic and protection regions 154, 136 and the periphery of the memory region 134 during subsequent etching.

A first top electrode mask 806 and a second top electrode mask 808 are formed respectively on the first and second top surface portions 804t1, 804t2 of the TEHM layer 804. Further, the first and second top electrode masks 806, 808 are formed respectively and directly above the first and second BEVAs 116a, 116b. The first and second top electrode masks 806, 808 may, for example, be or comprise photoresist and/or some other suitable mask material. In some embodiments in which the first and second top electrode masks 806, 808 are photoresist, the first and second top electrode masks 806, 808 may, for example, be formed by depositing a photoresist layer over the TEHM layer 804 and subsequently patterning the photoresist layer by photolithography. Other suitable processes for forming the first and second top electrode masks 806, 808 are, however, amenable.

Figure 9:
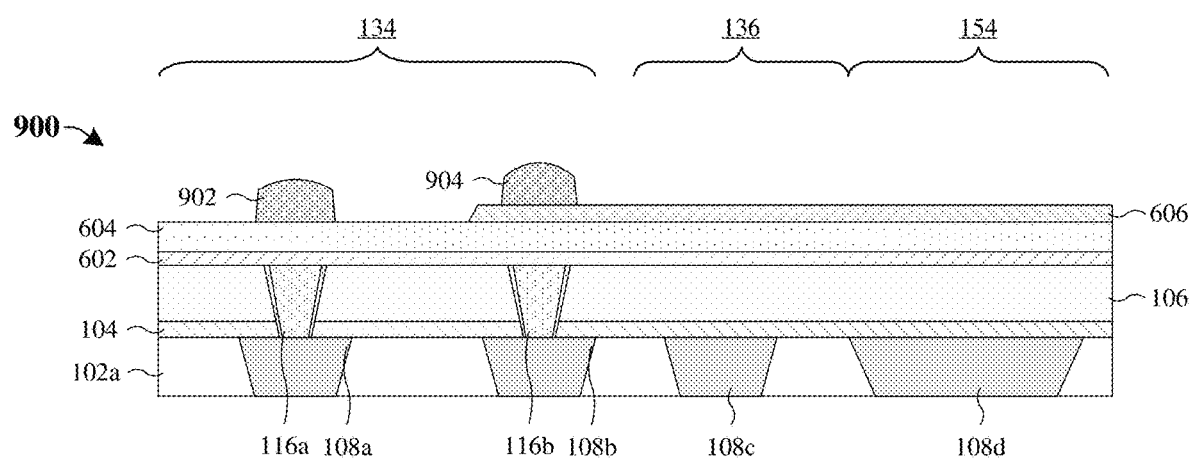

As illustrated in the cross-sectional view 900 of FIG. 9, a second etch is performed selectively into the TEHM layer 804 (see, e.g., FIG. 8) and the top electrode layer 802 (see, e.g., FIG. 8) with the first and second top electrode masks 806, 808 in place. Further, the TEHM layer 804 and the first and second top electrode masks 806, 808 are removed. In some embodiments, the second etch is performed by IBE. Further, in some embodiments, the second etch is performed by ion bombardment without chemical reaction. In other embodiments, the second etch is performed by some other suitable type of etching.

The second etch stops on the data storage layer 604 and the protection layer 606 and transfers a pattern of the first and second top electrode masks 806, 808 to the top electrode layer 802. As such, the second etch forms a first top electrode structure 902 and a second top electrode structure 904. The first top electrode structure 902 overlies the first lower wire 108a, and the second top electrode structure 904 overlies the second lower wire 108b. Further, whereas the first top electrode structure 902 is laterally offset from the protection layer 606, the second top electrode structure 904 is on the protection layer 606. As such, a top surface of the second top electrode structure 904 is elevated relative to a top surface of the first top electrode structure 902. In some embodiments, the second etch rounds the top surfaces of the first and second top electrode structures 902, 904.

In some embodiments, the first and second top electrode masks 806, 808 and/or the TEHM layer 804 are removed by the second etch. In other embodiments, the first and second top electrode masks 806, 808 and/or the TEHM layer 804 are removed after the second etch by another etch or some other suitable removal process.

Figure 10:
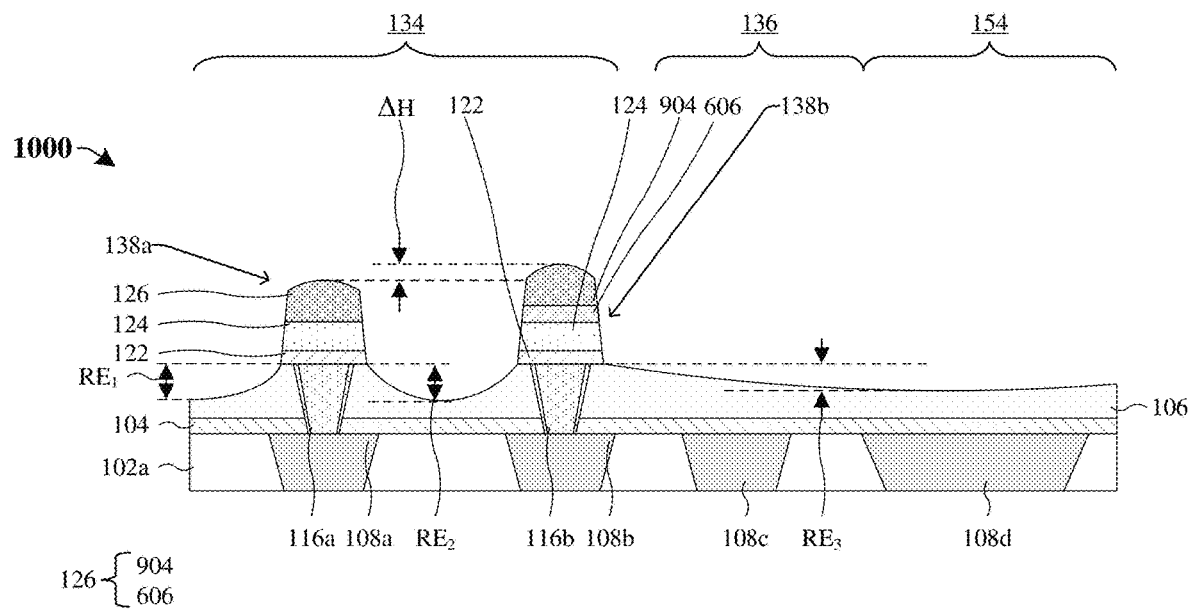

As illustrated in the cross-sectional view 1000 of FIG. 10, a third etch is performed selectively into the protection layer 606 (see, e.g., FIG. 9), the data storage layer 604 (see, e.g., FIG. 9), and the bottom electrode layer 602 (see, e.g., FIG. 9). Further, the third etch removes the protection layer 606 (see, e.g., FIG. 9).

The third etch stops on the ILD layer 106 and transfers a pattern of the first and second top electrode structures 902, 904 to the data storage layer 604 (see, e.g., FIG. 9) and the bottom electrode layer 602. As such, the third etch forms a first memory cell 138a and a second memory cell 138b respectively overlying the first and second lower wires 108a, 108b and electrically coupled respectively to the first and second lower wires 108a, 108b respectively by the first and second BEVAs 116a, 116b. In some embodiments, the first and second memory cells 138a, 138b are MRAM cells, resistive random-access memory (RRAM) cells, or some other suitable type of memory cells.

The first and second memory cells 138a, 138b comprise individual bottom electrodes 122, individual top electrodes 126, and individual data storage elements 124 respectively between the bottom and top electrodes 122, 126. The bottom electrodes 122 are formed from the bottom electrode layer 602, and the data storage elements 124 are formed from the data storage layer 604. In embodiments in which the first and second memory cells 138a, 138b are MRAM cells, the data storage elements 124 are or comprise MTJs. The top electrode 126 of the first memory cell 138a corresponds to the first top electrode structure 902. Further, because the protection layer 606 is conductive, the top electrode 126 of the second memory cell 138b includes the second top electrode structure 904 and a remaining portion of the protection layer 606 underlying the second top electrode structure 904. In other embodiments in which the protection layer 606 is dielectric, the top electrode 126 of the second memory cell 138b corresponds to the second top electrode structure 904. Because the top electrode 126 of the second memory cell 138b includes the remaining portion of the protection layer 606, the top electrode 126 of the first memory cell 138a has a height less than the top electrode 126 of the second memory cell 138b. In other words, there is a height differential ΔH between the top electrodes 126 of the first and second memory cells 138a, 138b.

The third etch further over etches into the ILD layer 106 to form a plurality of recesses. A first top surface portion arcs from the first memory cell 138a away from the second memory cell 138b to define a first recess $RE_1$. A second top surface portion arcs from the first memory cell 138a to the second memory cell 138b and defines a second recess $RE_2$. A third top surface portion arcs from the second memory cell 138b away from the first memory cell 138a and defines a third recess $RE_3$.

The third etch is performed by ion bombardment without chemical reaction. For example, the third etch is performed by IBE or some other suitable type of etching. Because the third etch does not employ chemical etching, it does not lead to chemical etch damage on memory sidewalls. Such chemical etch damage degrades electrical properties of the first and second memory cells 138a, 138b, such as ratios of ON/OFF resistances and coercivity. Therefore, by performing the third etch without chemical reaction, performance of the first and second memory cells 138a, 138b may be enhanced.

Because the third etch is performed by ion bombardment without chemical reaction, variations in feature density lead to variations in etch rate. The etch rate decreases as feature density increases and increases as feature density decreases. Therefore, because the memory region 134 has a higher feature density than the protection and logic regions 136, 154, the memory region 134 has slower etch rate than the protection and logic regions 136, 154. Further, because the protection layer 606 is at the logic and protection regions 154, 136 and the periphery of the memory region 134, but not the interior of the memory region 134, material thickness over the data storage layer 604 varies. For example, material thickness above the data storage layer 604 is greater at the logic and protection regions 154, 136 and the periphery of the memory region 134 than at the interior of the memory region 134.

Because of the variations in etch rate and the variations in material thickness, the over etching varies and depths of the recesses (e.g., the first recess $RE_1$, the second recess $RE_2$, etc.) may vary. In some embodiments, a lowest point of the first recess $RE_1$ is elevated relative to a lowest point of the second recess $RE_2$ and is recessed relative to a lowest point of the third recess $RE_3$. In other embodiments, the lowest point of the first recess $RE_1$ is level with the lowest point of the second recess $RE_2$, but the lowest points of the first and second recesses $RE_1$, $RE_2$ are still recessed relative to the lowest point of the third recess $RE_3$. In some embodiments, a depth of the third recess $RE_3$ directly over the third lower wire 108c is less than a depth of the second recess $RE_2$ at a center between the first and second memory cells 138a, 138b. Further, in some embodiments, the depth of the third recess $RE_3$ directly over the third lower wire 108c is the same as the depth at the lowest point of the third recess $RE_3$.

But for the increased material thickness from the protection layer 606, the increased etch rate at the protection region 136 may cause the over etching to extend through the ILD layer 106 and the etch stop layer 104 to the third lower wire 108c. For example, the third recess $RE_3$ may extend through the ILD layer 106 and the etch stop layer 104 to the third lower wire 108c. The resulting ion bombardment of the third lower wire 108c would then lead to extrusion or outward movement of material (e.g., copper or some other suitable material) from the third lower wire 108c, which could lead to contamination and reliability defects. However, because of the increased material thickness from the protection layer 606, the increased etch rate at the protection region 136 is countered and the over etching into the ILD layer 106 does not extend through the ILD layer 106 and the etch stop layer 104 to the third lower wire 108c. Therefore, the protection layer 606 prevents extrusion or outward movement of material from the third lower wire 108c and hence prevents contamination and reliability defects.

Figure 11:
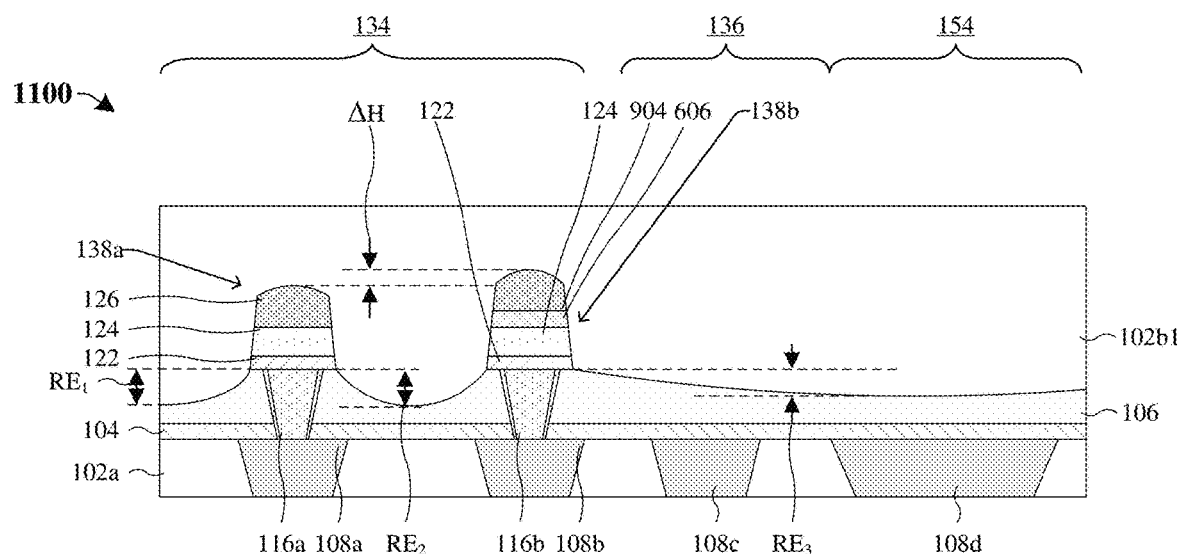

As illustrated in the cross-sectional view 1100 of FIG. 11, a first upper IMD layer 102b1 is deposited over the ILD layer 106, the first memory cell 138a, and the second memory cell 138b. Further, the first upper IMD layer 102b1 is deposited along sidewalls of the first and second memory cells 138a, 138b. The first upper IMD layer 102b1 may, for example, be or comprise silicon dioxide, a low-k dielectric material, an extreme low-k dielectric material, the same material as the lower IMD layer 102a, or the like. Deposition of the first upper IMD layer 102b1 may, for example, be performed by or comprise CVD, PVD, some other suitable deposition process, or any combination of the foregoing.

Figure 12:
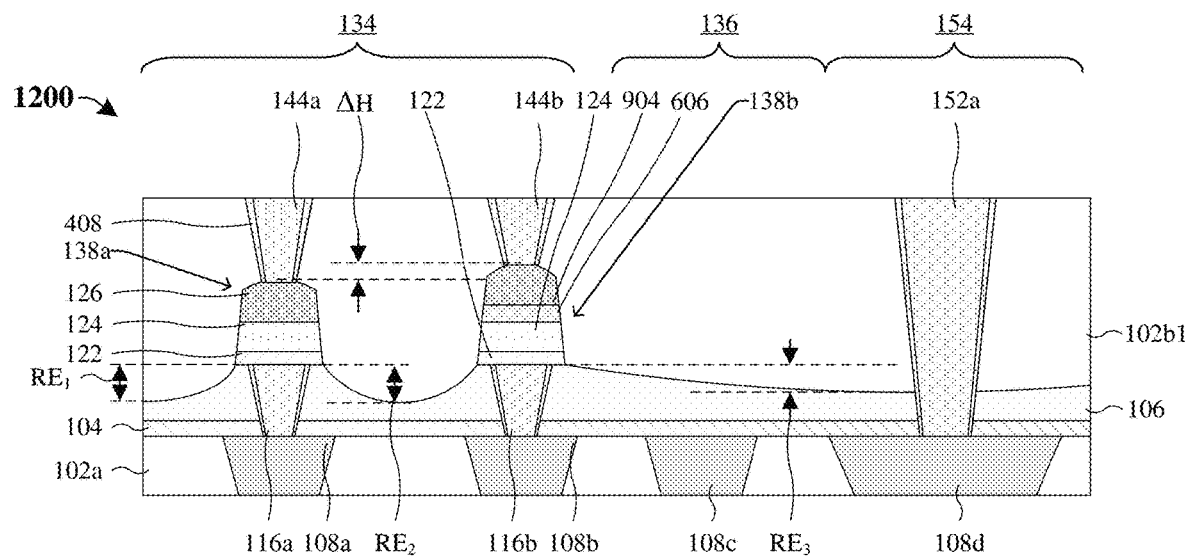

As illustrated in the cross-sectional view 1200 of FIG. 12, a first TEVA 144a, a second TEVA 144b, a first inter-wire via 152a, and liner barriers 408 are formed in the first upper IMD layer 102b1. The liner barriers 408 are formed lining the first TEVA 144a, the second TEVA 144b, and the first inter-wire via 152a. The first TEVA 144a, the second TEVA 144b, and the first inter-wire via 152a are formed respectively overlying and extending from the first memory cell 138a, the second memory cell 138b, and the fourth lower wire 108d. The first TEVA 144a, the second TEVA 144b, and the first inter-wire via 152a may be or comprise, for example, copper, aluminum copper, aluminum, tungsten, some other suitable metal, or some other suitable conductive material. The liner barriers 408 may be or comprise, for example, titanium nitride, tantalum, tantalum nitride, titanium, or some suitable other barrier material.

Figure 13:
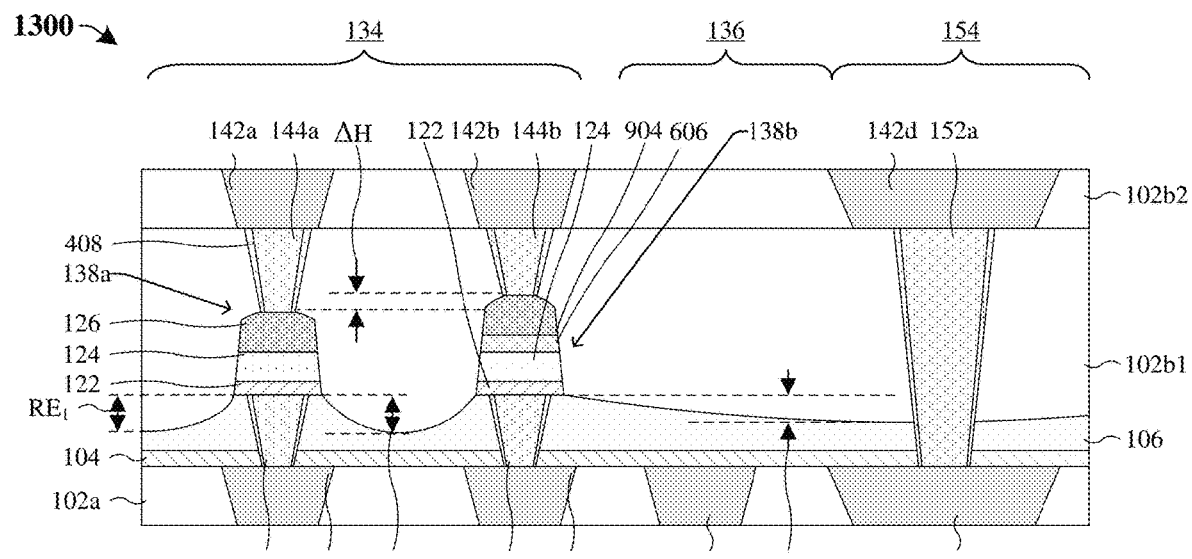

As illustrated in the cross-sectional view 1300 of FIG. 13, a second upper IMD layer 102b2 is deposited over the first TEVA 144a, the second TEVA 144b, and the first inter-wire via 152a. The second upper IMD layer 102b2 may, for example, be or comprise silicon dioxide, a low-k dielectric material, an extreme low-k dielectric material, the same material as the lower IMD layer 102a and/or the second upper IMD layer 102b2, or the like. Deposition of the second upper IMD layer 102b2 may, for example, be performed by or comprise CVD, PVD, some other suitable deposition process, or any combination of the foregoing.

A first upper wire 142a, a second upper wire 142b, and a third upper wire 142d are formed in the second upper IMD layer 102b2 and respectively on the first TEVA 144a, the second TEVA 144b, and the first inter-wire via 152a. The first, second, and third upper wires 142a, 142b, 142d may be or comprise, for example, copper, aluminum copper, aluminum, tungsten, some other metal, or some other suitable conductive material.

Although the cross-sectional views 500-1300 shown in FIGS. 5-13 are described with reference to a method, it will be appreciated that the structures shown in FIGS. 5-13 are not limited to the method but rather may stand alone separate of the method. Furthermore, although FIGS. 5-13 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

FIG. 14 illustrates a flow diagram of some embodiments of a method 1400 for forming an IC comprising memory cells is provided.

At act 1402, a first lower wire, a second lower wire, a third lower wire, and a fourth lower wire are formed within a lower IMD layer, and an etch stop layer is deposited over the lower IMD layer and the lower wires (e.g., the first lower wire, the second lower wire, etc.). An ILD layer 106 is deposited over the etch stop layer. A first BEVA and a second BEVA are formed within the ILD layer and etch stop layer. A bottom electrode layer is deposited over the ILD layer, the first BEVA, and the second BEVA, a data storage layer is deposited over the bottom electrode layer, and a protection layer is deposited over the data storage layer. A protection mask is formed over the protection layer and is formed extending over the second, third, and fourth lower wires. FIGS. 5 and 6 illustrate cross-sectional views 500 and 600 respectively corresponding to some embodiments of act 1402.

At act 1404, a first etch is performed selectively into the protection layer according to the protection mask to remove a portion of the protection layer covering the first lower wire. FIG. 7 illustrates cross-section view 700 corresponding to some embodiments of act 1404.

At act 1406, a top electrode layer is deposited over the data storage layer and the protection layer. A top electrode hard mask (TEHM) layer is deposited over the top electrode layer. First and second top electrode masks are formed respectively overlying the first and second BEVAs on the TEHM layer. FIG. 8 illustrates a cross-sectional view 800 corresponding to some embodiments of act 1406.

At act 1408, a second etch is performed selectively into the top electrode layer and the TEHM layer to form a first top electrode structure and a second top electrode structure respectively overlying the first and second lower wires. A top surface of the first top electrode structure is recessed relative to a top surface of the second top electrode structure. FIG. 9 illustrates cross-sectional view 900 corresponding to some embodiments of act 1408.

At act 1410, a third etch is performed selectively into the data storage layer and the bottom electrode layer with the first and second top electrode structures in place to form a first memory cell and a second memory cell. The third etch is performed by ion bombardment without chemical reaction. For example, the third etch is performed by IBE. Further, the third etch over etches into the ILD layer. A first top surface portion of the ILD layer arcs from the first memory cell away from the second memory cell and defines a first recess. A second top surface portion of the ILD layer arcs from the first memory cell to the second memory cell and defines a second recess. A third top surface portion of the ILD layer arcs across the third lower wire and fourth lower wire from the second memory cell and defines a third recess. Because the protection layer overlies the third lower wire, the third recess is shallower than the first and second recesses. FIG. 10 illustrates cross-sectional view 1000 corresponding to some embodiments of act 1410.

At act 1412, an interconnect structure is formed above the memory cells. The interconnect structure comprises upper wires and vias electrically coupled respectively to the first and second memory cells and the fourth lower wire. FIGS.

11 through 13 illustrate cross-sectional views 1100 through 1300 respectively corresponding to some embodiments of act 1412.

Although the method 1400 is illustrated and/or described as a series of acts or events, it will be appreciated that the method 1400 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In various embodiments, the present application provides a semiconductor structure comprising: a substrate; and a memory array spaced over the substrate and having a plurality of rows and a plurality of columns, wherein the memory array comprises a first memory cell and a second memory cell that are adjacent at a common elevation above the substrate, wherein the second memory cell is at an edge of the memory array and separates the first memory cell from the edge, and wherein a top surface of the first memory cell is recessed relative to a top surface of the second memory cell.

In various embodiments, the present application provides a semiconductor structure comprising: a substrate; a first wire, a second wire, and a third wire elevated above the substrate at a common elevation, wherein the second wire is between the first and third wires; a memory array laterally offset from the third wire and comprising a first memory cell and a second memory cell respectively overlying the first and second wires; a pair of vias extending respectively from the first and second memory cells respectively to the first and second wires; and an interlayer dielectric (ILD) layer having a top surface arcing from the second memory cell to the first memory cell and further arcing across the third wire from the second memory cell, wherein the top surface is recessed relative to a bottom surface of the second memory cell by a first amount at a center between the first and second memory cells, and wherein the top surface is recessed relative to the bottom surface by a second amount less than the first amount at a location directly over the third wire.

In various embodiments, the present application provides A method of forming a semiconductor device, comprising: providing a first wire, a second wire, and a third wire at a common elevation above a substrate, wherein the second wire is between the first and third wire, depositing a memory film covering the first, second, and third wires, wherein the memory film comprise a bottom electrode layer, a protection layer, and a data storage layer between the bottom electrode layer and the protection layer; performing a first etch selectively into the protection layer to remove the protection layer from directly over the first wire, wherein the first etch stops on the data storage layer, and wherein the protection layer persists directly over the second and third wires after the first etch; depositing a top electrode layer covering the first, second, and third wires over the data storage layer and the protection layer; and patterning the memory film and the top electrode layer to form a pair of memory cells respectively overlying the first and second wires and to remove the memory film and the top electrode layer from directly over the third wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a first wire, a second wire, and a third wire at a common elevation above a substrate, wherein the second wire is between the first and third wires,
    depositing a memory film covering the first, second, and third wires, wherein the memory film comprise a bottom electrode layer, a protection layer, and a data storage layer between the bottom electrode layer and the protection layer;
    performing a first etch selectively into the protection layer to remove the protection layer from directly over the first wire, wherein the first etch stops on the data storage layer, and wherein the protection layer persists directly over the second and third wires after the first etch;
    depositing a top electrode layer covering the first, second, and third wires over the data storage layer and the protection layer; and
    patterning the memory film and the top electrode layer to form a pair of memory cells respectively overlying the first and second wires and to remove the memory film and the top electrode layer from directly over the third wire.

2. The method of claim 1, wherein the patterning comprises:
    forming a pair of top electrode masks respectively overlying the first and second wires;
    performing a second etch into the top electrode layer with the pair of top electrode masks in place to form a pair of top electrode structures respectively overlying the first and second wires; and
    performing a third etch into the protection layer, the data storage layer, and the bottom electrode layer with the pair of top electrode structures in place.

3. The method of claim 2, wherein the third etch is performed by ion beam etching (IBE).

4. The method of claim 1, further comprising:
    depositing an interlayer dielectric (ILD) layer over the first, second, and third wires;
    wherein the memory film is deposited over the ILD layer, wherein the patterning comprises over etching into the ILD layer, and wherein the ILD layer persists directly over the third wire upon completion of the patterning.

5. The method of claim 4, wherein after etching the ILD layer, a first recess is formed within the ILD layer between the pair of memory cells, wherein the first recess is formed with a depth extending from a bottom surface of the bottom electrode layer to a first upper surface of the ILD layer, and after etching the ILD layer, a second recess is formed within the ILD layer laterally offset from the pair of memory cells and aligned over the third wire, wherein the second recess is formed with a depth extending from the bottom surface of the bottom electrode layer to a second upper surface of the ILD layer that is above the first upper surface of the ILD layer.

6. The method of claim 4, wherein the patterning forms a first memory cell of the pair of memory cells and a second memory cell of the pair of memory cells, wherein the first memory cell is formed with a top surface that is below a top surface of the second memory cell.

7. The method of claim 4, further comprising:
forming a plurality of vias within the ILD layer, wherein the plurality of vias are formed extending from a top surface of the first and second wires, and wherein the pair of memory cells are formed on the plurality of vias.

8. A method of forming a semiconductor device, comprising:
forming a memory film over a substrate and comprising a protection layer and a data storage layer, wherein the protection layer is formed on the data storage layer, and the protection layer has a sidewall within a memory region;
forming a top electrode layer over the memory film; and
performing an etch into the memory film and the top electrode layer to form a first memory cell and a second memory cell that are within the memory region and that are respectively on opposite sides of the sidewall of the protection layer, wherein the second memory cell includes a portion of the protection layer and has a top surface elevated relative to a top surface of the first memory cell by a thickness of the protection layer.

9. The method of claim 8, further comprising:
forming a lower inter-metal dielectric (IMD) layer over the substrate;
forming a first wire and a second wire within the memory region;
forming a third wire within a protection region laterally offset from the memory region;
forming an interlayer dielectric (ILD) layer over the IMD layer, wherein the ILD layer is formed completely covering the third wire; and
forming the second memory cell aligned over the second wire, at an edge of the memory region.

10. The method of claim 9, further comprising:
forming a via within the ILD layer, wherein the via contacts the second wire; and
forming the second memory cell on a top surface of the via.

11. The method of claim 10, wherein the etch extends into the memory film, the top electrode layer, and the ILD layer, wherein the etch forms a first top surface segment of the ILD layer arcing from a bottom surface of the memory film adjacent to the via to a location directly over the third wire.

12. The method of claim 11, wherein the etch forms a second top surface segment of the ILD layer arcing from a bottom surface of the second memory cell to a bottom surface of the first memory cell, wherein an elevation of the second top surface segment at a center between the first and second memory cells is recessed relative to an elevation of the first top surface segment at the location.

13. The method of claim 8, wherein the first memory cell is formed with a bottom surface that is at a common elevation with a bottom surface of the second memory cell.

14. A method of forming a semiconductor device, comprising:
forming a first wire, a second wire, and a third wire within a dielectric layer, wherein the second wire is formed between the first wire and the third wire, and wherein the dielectric layer is over a substrate;
forming an interlayer dielectric (ILD) layer over the first, second, and third wires;
forming a memory film layer on the ILD layer, wherein a data storage portion of the memory film layer is exposed directly over the first wire and a conductive protection portion of the memory film layer is exposed directly over the second wire upon etching, thereby completing the forming of the memory film layer;
forming a top electrode layer directly on the data storage portion and the conductive protection portion of the memory film layer; and
etching the top electrode layer, the memory film layer, and the ILD layer to form a first memory cell over the first wire and a second memory cell over the second wire, wherein the memory film layer and top electrode layer are removed from directly above the third wire, wherein the etching forms a first top surface of the ILD layer arcing from the second memory cell to the first memory cell, and wherein the etching forms a second top surface arcing across the third wire from the second memory cell.

15. The method of claim 14, wherein the first top surface is formed recessed relative to a bottom surface of the second memory cell by a first amount at a center between the first and second memory cells.

16. The method of claim 15, wherein the second top surface is formed recessed relative to the bottom surface of the second memory cell by a second amount less than the first amount at a location directly over the third wire.

17. The method of claim 14, further comprising:
forming an upper dielectric layer over the first memory cell, the second memory cell, and the ILD layer;
forming a first top electrode via through the upper dielectric layer and contacting the first memory cell; and
forming a second top electrode via through the upper dielectric layer and contacting the second memory cell.

18. The method of claim 17, wherein a top surface of the first top electrode via and a top surface of the second top electrode via have a common elevation above the substrate, and a height of the first top electrode via is greater than a height of the second top electrode via.

19. The method of claim 17, wherein the memory film layer comprises a plurality of layers and a protection layer overlying the plurality of layers, wherein the protection layer includes the conductive protection portion, wherein the plurality of layers overlies the first, second, and third wires, and wherein the protection layer overlies the second and third wires while being laterally offset from the first wire.

20. The method of claim 1, wherein the top electrode layer is deposited along a top surface of the data storage layer and a top surface of the protection layer.

* * * * *